(12) United States Patent  
Bechtel et al.

(10) Patent No.: US 7,800,123 B2  
(45) Date of Patent: Sep. 21, 2010

(54) ELECTROLUMINESCENCE DEVICE

(75) Inventors: Helmut Bechtel, Roetgen (DE); Wolfgang Busselt, Roetgen (DE); Peter Schmidt, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 67 days.

(21) Appl. No.: 11/915,320

(22) PCT Filed: May 9, 2006

(86) PCT No.: PCT/IB2006/051458

§ 371 (c)(1),
(2), (4) Date: Nov. 21, 2007

(87) PCT Pub. No.: WO2006/126119

PCT Pub. Date: Nov. 30, 2006

(65) Prior Publication Data

US 2008/0217636 A1    Sep. 11, 2008

(30) Foreign Application Priority Data

May 25, 2005  (EP) .................................. 05104445

(51) Int. Cl.  
*H01L 33/00* (2010.01)

(52) U.S. Cl. ............................. 257/98; 257/94; 257/13; 257/E33.027; 257/E33.028

(58) Field of Classification Search .................. 257/13, 257/94, 98, E33.027, E33.028  
See application file for complete search history.

(56) References Cited

U.S. PATENT DOCUMENTS

| 6,504,301 | B1 | 1/2003 | Lowery |
| 6,635,363 | B1 | 10/2003 | Duclos |
| 2004/0145308 | A1 | 7/2004 | Rossner |
| 2004/0223315 | A1 | 11/2004 | Suehiro |
| 2005/0006659 | A1 | 1/2005 | Ng |

*Primary Examiner*—Long Pham

(57) ABSTRACT

An electroluminescence device includes at least one electroluminescence light source for emitting a primary radiation, such as having wavelengths between 200 nm and 490 nm, and at least one light-converting element, arranged in the path of the rays of the primary radiation, for partial absorption of the primary radiation and emission of a secondary radiation. The light-converting element has a dilatation or expansion in the radiation direction of the primary radiation, which is less than an average scattering length of the primary radiation in the light-converting element.

19 Claims, 2 Drawing Sheets

ELECTROLUMINESCENCE DEVICE

The invention relates to an electroluminescence device, an element for color conversion of the emitted light as well as a method of manufacturing this element.

Phosphor-converted electroluminescence devices (pcLEDs) which have an electroluminescence light source (LED) and whose emitted light (primary radiation) is absorbed at least partly by a phosphor-powder layer and radiated again with a longer wavelength (secondary radiation) are known. What are referred to as pcLEDs are generally used as white light sources, wherein the LEDs emit UV or blue light (primary radiation), of which one part is absorbed by a layer arranged on the LED, typically a phosphor-powder layer and is re-emitted, for example, as yellow or green and red light (secondary radiation). This process is also denoted as color or light conversion. White light is then obtained by means of additive color mixing. The best pcLEDs available today have a ratio between emitted photons with a phosphor layer (primary radiation and secondary radiation) and without a phosphor layer (primary radiation), what is referred to as a package gain, of less than 50%. Since phosphor-powder layers are composed of a matrix material with phosphor particles embedded therein, the efficiency of the light source decreases with service life as a result of a temperature-induced or photochemically induced degradation of the matrix material due to the UV portion of the LED emission, and hence a reduction of the light transparency of the powder layer. Additionally, the homogeneity of the light emission of a pcLED depends heavily on the homogeneity of the phosphor-powder layer. For example, what is referred to as the correlated color temperature (CCT) can vary between 4500 K and 6500 K as a function of the viewing angle.

Document DE10349038A1 discloses a phosphor-converted electroluminescence device for emitting white light, wherein the color conversion is achieved by means of a polycrystalline ceramic body, which is arranged above the LED, viewed in the light radiation direction. In contrast to phosphor-powder layers, the ceramic body does not require a temperature or light-sensitive matrix material for embedding the phosphor particles and hence a reduction of the efficiency as a function of the service life due to degradation of the optical characteristics of the matrix material is avoided. The homogeneity of the light emission, for example a color temperature that is as independent of the viewing angle as possible, is caused by scattering of the primary and secondary radiation at the crystallites in the polycrystalline material. However, the package gain vis-à-vis pcLEDs having phosphor-powder layers does not improve with this type of polycrystalline materials. A significantly higher package gain is thus further desirable.

It is therefore an object of this invention to provide a phosphor-converted electroluminescence device, which is characterized by a high package gain in conjunction with a color temperature that is as independent of the viewing angle as possible.

This object is achieved by an electroluminescence device which comprises at least one electroluminescence light source for emitting a primary radiation, preferably having wavelengths between 200 nm and 490 nm, and at least one light-converting element, arranged in the path of the rays of the primary radiation, for the partial absorption of the primary radiation and emission of a secondary radiation, the light-converting element having a dilatation in the radiation direction of the primary radiation, which is smaller than an average scattering length of the primary radiation in the light-converting element. The smaller the amount of light scattered within the light-converting element, the shorter the optical path in the respective material, and hence the probability that the light is absorbed in the light-converting material without subsequent re-emission is reduced. Thus, the package gain that can be obtained is higher than with strongly scattering light-converting elements, for example powder layers or usual polycrystalline layers with scattering centers. According to the Lambert Beer law, the loss of radiation intensity $I_{loss}(\Theta)$ in a direction $\Theta$ due to absorption and scattering can be described as a function of the absorption and scattering lengths $l_a$ and $l_s$ instead of as a function of the transmission and reflection coefficients. The average scattering length of a material having a dilatation d along the direction of propagation of radiation, which material has an average packing density PD at scattering centers, is then approximately proportional to 1/PD.

In this connection, it is favorable if the light-converting element is composed of a material having a density between 93% and 99.5% of the theoretical material density in the light-converting element.

In a favorable electroluminescence device, the secondary radiation comprises one or more spectral regions with wavelengths larger than those of the primary radiation. White light can be produced, for example, by mixing suitable portions of a blue primary radiation and yellow or green and red secondary radiation.

In this connection, it is favorable that an average absorption length of the primary radiation in the light-converting element is smaller than the average scattering length of the primary radiation, and preferably smaller than the dilatation of the light-converting element in the radiation direction of the primary radiation. Thus, it is ensured that a sufficient part of the primary radiation is converted into secondary radiation for the generation of white light.

It is particularly favorable if the light-converting element comprises a first, essentially planar, surface, which faces the electroluminescence light source, and a second surface, which has a structure for improving the light outcoupling from the light-converting element. The first, planar surface enables a direct application of the light-converting element onto the electroluminescence light source. The structured second surface is used for an improved light outcoupling of primary and secondary radiation from the light-converting element and additionally leads to an improved homogeneity of the outcoupled light by the light-distributing effect of a structured surface. By virtue thereof, the variation of the correlated color temperature as a function of the viewing angle is clearly reduced.

In a preferred embodiment, at least the side of the light-converting element facing away from the electroluminescence light source is surrounded by an outcoupling element of at least one transparent material having a refractive index $n_A > 1.3$. It is still more favorable if the light-converting element has a refractive index $n_C$ and $|n_C - n_A| > 0.1$. On the one hand, light outcoupling losses, due to total reflections, when light is coupled out of the light-converting element can be reduced for $n_A < n_C$ and can be avoided for $n_A \geq n_C$. On the other hand, the light distributing effect of the second surface is further maintained by a minimum difference $|n_C - n_A| > 0.1$ of the refractive indices in the case of a structured second surface of the light-converting element.

In a particularly preferred embodiment, the light-converting element converts between 75% and 90%, preferably between 80% and 85%, of the primary radiation into secondary radiation. With this proportion of primary radiation to total radiation (primary plus secondary radiation), the smallest variation of the color temperature as a function of the viewing angle is obtained.

In this connection, it is favorable if the light-converting element has a dilatation of at least 50 μm in the radiation direction of the primary radiation.

Here, favorable materials of the light-converting element comprise at least one material from the groups consisting of $(M^I_{1-x-y}M^{II}_xM^{III}_y)_3(Al_{1-z}M^{IV}_z)_5O_{12}$ wherein $M^I$=(Y, Lu); $M^{II}$=(Gd, La, Yb); $M^{III}$=(Tb, Pr, Ce, Er, Nd, Eu) and $M^{IV}$=(Gd, Sc) with $0 \leq x \leq 1$; $0 \leq y \leq 0.1$ and $0 \leq z \leq 1$ $(M^I_{1-x-y}M^{II}_xM^{III}_y)_2O_3$ wherein $M^I$=(Y, Lu); $M^{II}$=(Gd, La, Yb) and $M^{III}$=(Tb, Pr, Ce, Er, Nd, Eu, Bi, Sb) with $0 \leq x \leq 1$ and $0 \leq y \leq 0.1$, $(M^I_{1-x-y}M^{II}_xM^{III}_y)S_{1-z}Se_z$ wherein $M^I$=(Ca, Sr, Mg, Ba); $M^{II}$=(Ce, Eu, Mn, Tb, Sm, Pr, Sb, Sn) and $M^{III}$=(K, Na, Li, Pb, Zn) with $0 \leq x \leq 0.01$; $0 \leq y \leq 0.05$ and $0 \leq z \leq 1$ $(M^I_{1-x-y}M^{II}_xM^{III}_y)O$ wherein $M^I$=(Ca, Sr, Mg, Ba); $M^{II}$=(Ce, Eu, Mn, Tb, Sm, Pr) and $M^{III}$=(K, Na, Li, Pb, Zn) with $0 \leq x \leq 0.1$ and $0 \leq y \leq 0.1$ $(M^I_{2-x}M^{II}_xM^{III}_2)O_7$ wherein $M^I$=(La, Y, Gd, Lu, Ba, Sr); $M^{II}$=(Eu, Tb, Pr, Ce, Nd, Sm; Tm) and $M^{III}$=(Hf, Zr, Ti, Ta, Nb) with $0 \leq x \leq 1$, $(M^I_{1-x}M^{II}_xM^{III}_{1-y}M^{IV}_y)O_3$ wherein $M^I$=(Ba, Sr, Ca, La, Y, Gd, Lu); $M^{II}$=(Eu, Tb, Pr, Ce, Nd, Sm, Tm); $M^{III}$=(Hf, Zr, Ti, Ta, Nb) and $M^{IV}$=(Al, Ga, Sc, Si) with $0 \leq x \leq 0.1$ and $0 \leq y \leq 0.1$.

Here, the manner of referring to $M^I$, for example, $M^I$=(Ca, Sr, Mg, Ba) should denote not only the individual elements, but also compounds of the elements in parentheses.

Furthermore, the invention relates to a method of manufacturing a light-converting element in an electroluminescence device as claimed in claim 1, which method comprises the following steps:

Sintering the material of the light-converting element at a temperature between 1700 and 1750° C. for a duration between 2 and 8 hours under reductive conditions or in a vacuum using a sintering aid, preferably magnesium oxide or silicon oxide in a quantity between 500 and 1000 ppm with respect to the ceramic main phase of the material, at a temperature between 1700 and 1750° C. for a duration between 10 and 24 hours, Sintering the material of the light-converting element at a temperature between 1700 and 1750° C. for a duration between 9 and 11 hours under an argon atmosphere at a pressure between 0.5 and 2.0 kbar, Annealing the material of the light-converting element at a temperature between 1200 and 1400° C. for a duration between 2 and 20 hours under an oxygen-containing atmosphere, preferably air.

A material with a high density and correspondingly smaller number of scattering centers per volume is manufactured by this method, resulting in an increase of the scattering length in the light-converting element.

These and other aspects of the invention are apparent from and will be elucidated with reference to the embodiments described hereinafter, though the invention should not be considered as limited to these.

Figure 1:
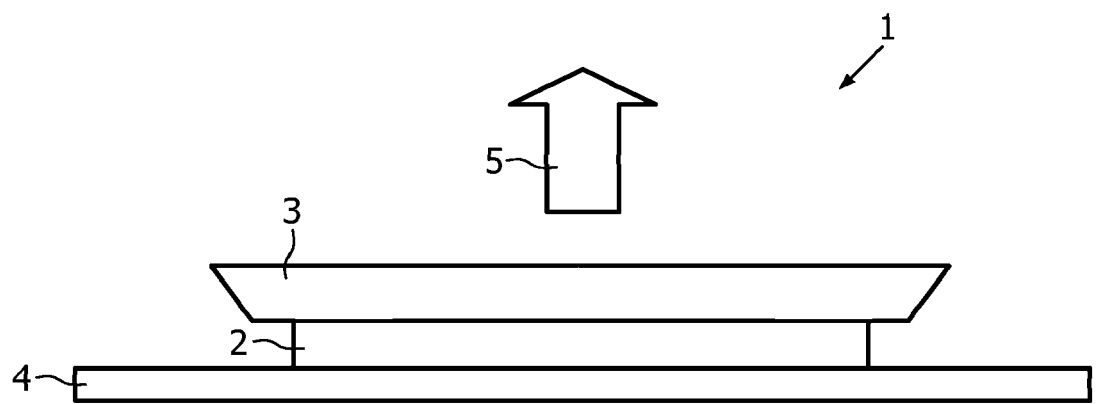
FIG. 1 shows an electroluminescence device in accordance with the invention.

FIG. 1 shows an electroluminescence device 1 in accordance with the invention having an electroluminescent light source 2 applied on a substrate 4 for emitting a primary radiation, and a light-converting element 3 arranged in the path of the rays of the primary radiation (along the radiation direction 5) for the partial absorption of the primary radiation and emission of a secondary radiation, the light-converting element 3 having a dilatation in the radiation direction 5 of the primary radiation, which is smaller than the average scattering length of the primary radiation in the light-converting element.

According to the Lambert Beer law, the loss of radiation intensity $I_{loss}(\Theta)$ in a direction $\Theta$ due to absorption and scattering instead of transmission and reflection coefficients can be described as a function of absorption and scattering lengths $l_a$ and $l_s$. The average scattering length of a non-monocrystalline material having a dilatation d along the direction of propagation of radiation and an average packing density PD at the scattering centers is then approximately proportional to d/PD. The longer the scattering length, the smaller the average optical paths of the primary and secondary radiation are and hence also the light losses by absorption without subsequent re-emission in the light-converting element. With a scattering center volume $V_s$ and a number N of scattering centers in a light-converting element having a volume V, the packing density PD is PD=$N*V_s/V$. For example, a scattering length of 3.33-fold the dilatation of the scattering material in the direction of propagation of the light results for spherical scattering centers with a 10 percent packing density. In this connection, the proportionality constant depends among other things on type and form of the scattering center and thus on the material composition of the light-converting element 3.

LEDS having organic or non-organic electroluminescent layers can be used as an electroluminescent light source 2, which layers are arranged between two electrodes and applied as a rule on a transparent base. In this connection, it is favorable if the base is transparent to both the primary and the secondary radiation. Typically, the electrode facing the substrate 4 is reflective, so that the primary radiation is emitted to the side facing away from the substrate, represented in FIG. 1 by the arrow 5. In this connection, the electroluminescent light source 2 can also comprise a plurality of LEDS with the same and/or different primary radiation. Here, the light-converting element 3 is arranged in the path of rays of the primary radiation to absorb primary radiation. It can be applied directly on the electroluminescent light source 2 or coupled optically to the electroluminescent light source 2 by means of transparent materials. For the optical coupling of the light-converting element 3 to the electroluminescent light source 2, for example, use can be made, between the light-converting element 3 and the electroluminescence light source 2, of adhesion layers of elastic or hard materials having a refractive index between 1.4 and 3.0 such as, for example, cross-linkable two-component silicon rubbers, which are platinum cross-linked, or alternatively glass materials, which are attached to the light source and the light converting element at high temperatures. Furthermore, it is particularly favorable if the light-converting element is brought into close contact with the electroluminescent light source, so that the distance between the two is on an average less than 3 times the average wavelength of the primary radiation, preferably 2 times the average wavelength of the primary radiation, particularly preferably once the average wavelength of the primary radiation. However, in other embodiments a plurality of light-converting elements, which differ with respect to their arrangement, size, geometry or material, can also be connected optically to one or more electroluminescent light sources.

The average wavelength of the primary radiation preferably lies in a wavelength range between 200 nm and 490 nm, so that all further spectral regions necessary for producing white light by means of mixing primary radiation and secondary radiation can be excited. In the case of blue primary radiation, the secondary radiation therefore preferably comprises light in the yellow or green and red spectral region, which enables white light to be produced by means of color mixing.

In order to make sure that the portion of longer-wave secondary radiation necessary for generating white light can be also provided by means of thin light-converting elements, a minimum of absorption of the primary radiation in the light-converting element is necessary. For this purpose, it is favorable that the average absorption length of the primary radiation in the light-converting element 3 is smaller than the average scattering length of the primary radiation, preferably smaller than the dilatation of the light-converting element 3 in the radiation direction 5 of the primary radiation. Here, the secondary radiation emitted after absorption of the primary radiation is isotropically emitted. As a result of a material-induced multiple reflection of the primary radiation at the surfaces of the light-converting element 3, and the associated variation of the direction of propagation of the primary radiation in the light-converting element 3, the electroluminescence device 1 in accordance with the invention is also characterized by a smaller variation of the so-termed correlated color temperature (CCT) as a function of the viewing angle.

A package gain of 70% is obtained in an example of embodiment of an electroluminescence device in accordance with the invention with a geometry of the light-converting element 3, as suitably shown in FIG. 1, having a thickness of 1.0 mm and an angle of 45° of the side faces of the light-converting element 3 to the radiation direction 5, which element is composed of a YAG-ceramic doped with 0.3% Ce. This corresponds to a significant improvement over the conventional light-converting elements of phosphor-powder layers.

Figure 2:
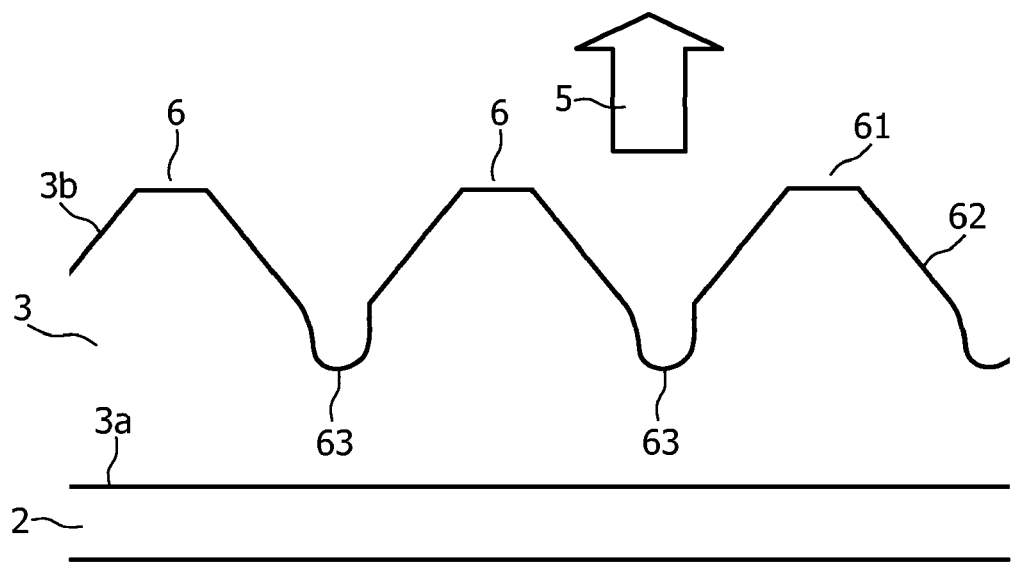
FIG. 2 shows a structured light-converting element in accordance with the invention.

In a favorable embodiment of the electroluminescence device 1 in accordance with the invention, the light-converting element 3 has a first essentially planar surface 3a, which enables direct application onto an electroluminescent light source 2, and a second surface 3b, which has a structure 6 for improving the light outcoupling from the light-converting element 3. A particularly favorable example of embodiment of a light-converting element 3 having a structured second surface 3b is shown in FIG. 2. Here, the structure 6 comprises first areas 61 arranged essentially parallel to the first surface 3a, and tapering second areas 62, viewed in the radiation direction 5. By virtue of the tapering areas, an enhancement of the direct light outcoupling is achieved of the part of the light which propagates in the light-converting element 3 at large angles relative to the radiation direction 5. The essentially planar first areas 61 enable direct outcoupling of the light which propagates in the light-converting element at small angles relative to the radiation direction 5. In a particularly favorable embodiment, the light-converting element comprises third areas 63, which are arranged essentially parallel to the first surface 3a and below the second areas 62, viewed in the radiation direction 5.

An example of embodiment of such a structured second surface 3b comprises a structure 6 having a depth (distance between first areas 61 and third areas 63, viewed in the radiation direction 5) of 180 µm at a thickness of 350 µm of the light-converting element, a distance of 500 µm between neighboring first areas 63, and second areas 62, which are arranged at an angle of 45° to the first surface 3a. Such structures can be manufactured, for example, with what is referred to as a "dicing machine" of the company Disco Corporation. For this purpose, firstly grooves 200 µm wide and 180 µm deep are cut into the essentially planar surface of the light-converting element and subsequently enlarged by means of what is referred to as a 90° dicing disk of the A1A series. By means of another groove distance, another groove geometry, another dicing disk and/or another cutting depth, the structures 6 can be adapted to different requirements with respect to light outcoupling and light distributing effect.

Figure 3:
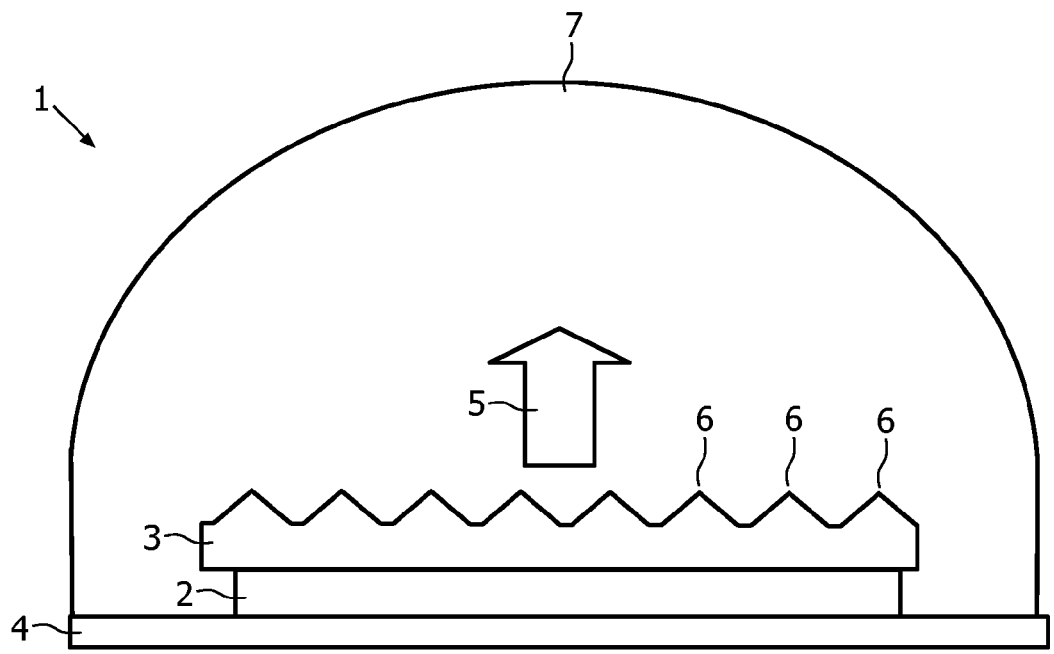
FIG. 3 shows an electroluminescence device having one outcoupling element, in accordance with the invention.

For an improved light outcoupling of the primary and secondary radiation from the light-converting element 3 having a refractive index $n_C$, a particularly favorable embodiment comprises an outcoupling element 7 of at least one transparent material having a refractive index $n_A$>1.3, which surrounds at least the side of the light-converting element 3 facing away from the electroluminescent light source 2, see FIG. 3. In case $n_C$>$n_A$, light outcoupling losses in light radiation direction 5 from the light-converting element 3 due to total reflections on the side of the light-converting element 3 facing away from the electroluminescent light source 2 can be reduced because of the smaller refractive index difference relative to a transition to air. If $n_C$<$n_A$, outcoupling losses in the light-converting element are prevented due to a transition from an optically thinner medium (light-converting element 3) to an optically thicker medium (outcoupling element 7). In both cases it is favorable if the outer surface of the outcoupling element 7, viewed in the light radiation direction 5, has a concave surface (see FIG. 3), viewed from the side of the air, for decreasing the portion of the light reflected back at the boundary surface of the outcoupling element and air.

In the exemplary embodiment shown in FIG. 3, both the electroluminescent light source 2 and the light-converting element 3 applied on the electroluminescent light source 2 are surrounded by the outcoupling element 7 having at least one transparent material, which outcoupling element has an outer concave surface, viewed in the light radiation direction 5. But the invention also includes different embodiments, in which the light-converting element 3 and/or the electroluminescent light source 2 are only partly surrounded by the outcoupling element 7. Likewise, the invention includes embodiments having a non-concave outer surface of the outcoupling element 7, viewed in the light radiation direction 5. Also, the outcoupling element 7 can comprise several transparent materials. In addition to light outcoupling, the outcoupling element 7 can also be used for the purpose of influencing the radiation characteristic of the light source with regard to the angular distribution of the total radiation. If the light-converting element 3 has a structured second surface 3b, then it is particularly favorable if the transparent material of the outcoupling element 7 has a refractive index $n_A$ not equal to the refractive index $n_C$ of the light-converting element 3. In addition to the particularly high package-gain of such an arrangement, the favorable light distributing effect is maintained enabling the generation of a correlated color temperature that varies little with the emission angle when the difference of the refractive indices $|n_C-n_A|$>0.1 independent of whether $n_C$ is larger or smaller than $n_4$. With such a particularly favorable embodiment, a package gain of above 70% can be achieved, which represents a distinct improvement over conventional pcLEDs having phosphor-powder layers as light-converting elements.

Figure 4:
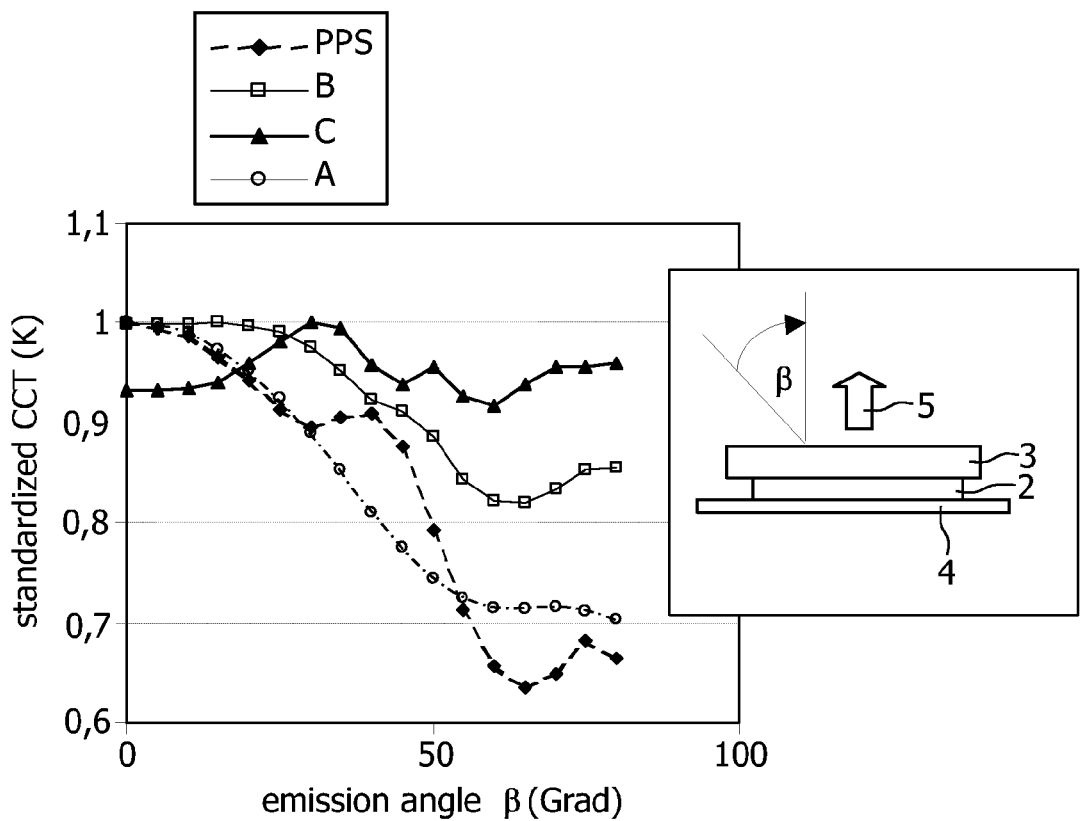
FIG. 4 shows correlated color temperatures as a function of the emission angle for different pcLEDs.

FIG. 4 shows the correlated color temperature (CCT) in Kelvin, normalized to the respective maximum, as a function of the emission angle β relative to the radiation direction 5 of the electroluminescence device comprising an electroluminescence light source 2 emitting in blue (having wavelengths <490 nm) and a light-converting element 3 applied on the electroluminescence light source, which light-converting element 3 is made of a YAG:Ce powder layer for producing secondary radiation in the yellow spectral region, surrounded by an outcoupling element having a concave surface shape. White light is produced via additive color mixing. In the comparison between conventional phosphor-powder layers (curve PPS) and light-converting elements 3 (curves A, B and C) in accordance with the invention, the data shows that the color temperature varies substantially with the emission angle. In the case of typical light-converting elements consisting of phosphor-powder layers, the correlated color temperature varies between 6500K (0° emission angle) and 4500K (65° emission angle), which corresponds to a variation of almost 40% and represents a disturbing visible effect for the viewer. The electroluminescence device in accordance with the invention, which comprises a light-converting element that, in contrast to phosphor-powder layers, has a large scattering length, shows a smaller variation of the correlated color temperature, see curve A in FIG. 4. Here, the values lie between 6762K and 4760K, which corresponds to a variation of 30%.

A preferred light-converting element 3 having a structured second surface 3b (curve B) shows a still more clearly reduced variation of the correlated color temperature as a function of the emission angle β. Here, the color temperature varies between 6765 K and 5542 K, which corresponds to a variation smaller than 20%.

The variation of the color temperature via the emission angle can be further improved by a favorable ratio between primary and secondary radiation. It is particularly favorable if the light-converting element 3 converts between 75% and 90%, preferably between 80% and 85%, of the primary radiation into secondary radiation. For example, the correlated color temperature varies as a function of the emission angle merely between 5406K and 4836K at a percentage of the blue primary radiation to the total radiation of 16.7%, see FIG. 4, curve C. As a result, this variation by less than 9% represents the most homogeneous color impression for the viewer.

In this connection, depending upon the application area and the desired resulting emission color, favorable light-converting elements are composed of at least one material from the groups consisting of

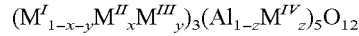

wherein $M^I$=(Y, Lu); $M^{II}$=(Gd, La, Yb); $M^{III}$=(Tb, Pr, Ce, Er, Nd, Eu) and $M^{IV}$=(Gd, Sc) with $0 \leq x \leq 1$; $0 \leq y \leq 0.1$ and $0 \leq z \leq 1$

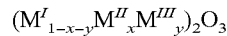

wherein $M^I$=(Y, Lu); $M^{II}$=(Gd, La, Yb) and $M^{III}$=(Tb, Pr, Ce, Er, Nd, Eu, Bi, Sb) with $0 \leq x \leq 1$ and $0 \leq y \leq 0.1$,

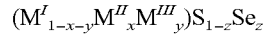

wherein $M^I$=(Ca, Sr, Mg, Ba); $M^{II}$=(Ce, Eu, Mn, Tb, Sm, Pr, Sb, Sn) and $M^{III}$=(K, Na, Li, Pb, Zn) with $0 \leq x \leq 0.01$; $0 \leq y \leq 0.05$ and $0 \leq z \leq 1$

wherein $M^I$=(Ca, Sr, Mg, Ba); $M^{II}$=(Ce, Eu, Mn, Tb, Sm, Pr) and $M^{III}$=(K, Na, Li, Pb, Zn) with $0 \leq x \leq 0.1$ and $0 \leq y \leq 0.1$

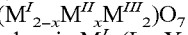

wherein $M^I$=(La, Y, Gd, Lu, Ba, Sr); $M^{II}$=(Eu, Tb, Pr, Ce, Nd, Sm; Tm) and $M^{III}$=(Hf, Zr, Ti, Ta, Nb) with $0 \leq x \leq 1$,

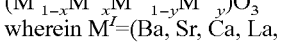

wherein $M^I$=(Ba, Sr, Ca, La, Y, Gd, Lu); $M^{II}$=(Eu, Tb, Pr, Ce, Nd, Sm, Tm); $M^{III}$=(Hf, Zr, Ti, Ta, Nb) and $M^{IV}$=(Al, Ga, Sc, Si) with $0 \leq x \leq 0.1$ and $0 \leq y \leq 0.1$.

Here, the manner of referring to $M^I$, for example, $M^I$=(Ca, Sr, Mg, Ba) should denote not only the individual elements for $M^I$, but also compounds of the elements in parentheses.

Standard techniques for mixing oxidic precursor powders, grinding, granulating and pressing of ceramic green bodies can be used for manufacturing light-converting elements. The scattering behavior in accordance with the invention is achieved by special sintering methods, of which two methods are described below by way of example:

1) Sintering of the ceramic at 1700-1750° C. for 2-8 h under reducing conditions, which results in materials having a density >96% of the theoretical density without porosity.

Subsequently, the material is sintered at 1750° C. under argon gas pressure (0.500 kbar-2 kbar) for 10 h, in order to remove residual porosities.

2) Vacuum sintering of the ceramic using a sintering auxiliary phase (MgO or SiO2, 500-1000 wt-ppm with respect to the ceramic main phase) at 1750° C. for 10-24 h.

After the steps 1) or 2), an annealing step in air or in an oxygen-containing atmosphere at 1200-1400° C. for 2-20 h (depending upon sample thickness) is necessary for improving the luminescence characteristics. If necessary, the samples can previously be separated into layers having a thickness of less than 3 mm, preferably less than 2 mm, particularly preferably less than 1 mm.

With the given composition of the material, the thickness of the light-converting element 3 is to be adapted to the desired ratio between primary and secondary radiation. In this connection, it is favorable if the thickness of the light-converting element 3 is at least 50 μm, viewed in the radiation direction 5.

The embodiments explained by means of the Figures and the description only represent examples for improving the package gain and reducing the variation of the correlated color temperature as a function of the emission angle of an electroluminescence device, and should not be construed as a limitation of the patent claims to these examples. Alternative embodiments are also possible for those skilled in the art, which embodiments are likewise covered by the scope of protection of the patent claims. The numbering of the dependent claims should not imply that other combinations of the claims do not represent favorable embodiments of the invention.

The invention claimed is:

1. An electroluminescence device comprising:
   an electroluminescence light source for emitting a primary radiation; and
   a light-converting element, arranged in a path of the primary radiation, for partial absorption of the primary radiation and emission of a secondary radiation; wherein the light-converting element has an expansion in a radiation direction of the primary radiation, the expansion being smaller than an average scattering length of the primary radiation in the light-converting element.

2. The electroluminescence device as claimed in claim 1, wherein the light-converting element comprises a material which has a density between 93% and 99.5% of a theoretical material density in the light-converting element.

3. The electroluminescence device as claimed in claim 1, wherein the secondary radiation comprises one or more spectral regions having lengths larger than a wavelength of the primary radiation.

4. The electroluminescence device as claimed in claim 1, wherein an average absorption length of the primary radiation in the light-converting element is smaller than the average scattering length of the primary radiation, and smaller than the expansion of the light-converting element in the radiation direction of the primary radiation.

5. The electroluminescence device as claimed in claim 1, wherein the light-converting element comprises a first, essentially planar, surface, which faces the electroluminescence light source, and a second surface, which has a structure for improving the light outcoupling from the light-converting element.

6. The electroluminescence device as claimed in claim 1, wherein at least a side of the light-converting element facing away from the electroluminescence light source is surrounded by an outcoupling element of at least one material having a refractive index $n_A$>1.3.

7. The electroluminescence device as claimed in claim 6, wherein the light-converting element has a refractive index $n_C$ and $|n_C-n_A|$>0.1.

8. The electroluminescence device as claimed in claim 1, wherein the light-converting element converts between 75% and 90% of the primary radiation into the secondary radiation.

9. The electroluminescence device as claimed in claim 1, wherein the expansion of the light-converting element is at least 50 μm in the radiation direction of the primary radiation.

10. An electroluminescence device as claimed in claim 1, wherein the light-converting element comprises at least one material from the groups consisting of:

$(M^I_{1-x-y}M^{II}_xM^{III}_y)_3(Al_{1-z}M^{IV}_z)_5O_{12}$, wherein $M^I$=(Y, Lu); $M^{II}$=(Gd, La, Yb); $M^{III}$=(Tb, Pr, Ce, Er, Nd, Eu) and $M^{IV}$=(Gd, Sc) with $0\leq x\leq 1$; $0\leq y\leq 0.1$ and $0\leq z\leq 1$, $(M^I_{1-x-y}M^{II}_xM^{III}_y)_2O_3$, wherein $M^I$=(Y, Lu); $M^{II}$=(Gd, La, Yb) and $M^{III}$=(Tb, Pr, Ce, Er, Nd, Eu, Bi, Sb) with $0\leq x\leq 1$ and $0\leq y\leq 0.1$, $(M^I_{1-x-y}M^{II}_xM^{III}_y)S_{1-z}Se_z$, wherein $M^I$=(Ca, Sr, Mg, Ba); $M^{II}$=(Ce, Eu, Mn, Tb, Sm, Pr, Sb, Sn) and $M^{III}$=(K, Na, Li, Pb, Zn) with $0\leq x\leq 0.01$; $0\leq y\leq 0.05$ and $0\leq z\leq 1$, $(M^I_{1-x-y}M^{II}_xM^{III}_y)O$, wherein $M^I$=(Ca, Sr, Mg, Ba); $M^{II}$=(Ce, Eu, Mn, Tb, Sm, Pr) and $M^{III}$=(K, Na, Li, Pb, Zn) with $0\leq x\leq 0.1$ and $0\leq y\leq 0.1$, $(M^I_{2-x}M^{II}_xM^{III}_2)O_7$, wherein $M^I$=(La, Y, Gd, Lu, Ba, Sr); $M^{II}$=(Eu, Tb, Pr, Ce, Nd, Sm, Tm) and $M^{III}$=(Hf, Zr, Ti, Ta, Nb) with $0\leq x\leq 1$, $(M^I_{1-x}M^{II}_xM^{III}_{1-y}M^{IV}_y)O_3$, wherein $M^I$=(Ba, Sr, Ca, La, Y, Gd, Lu); $MI^I$=(Eu, Tb, Pr, Ce, Nd, Sm, Tm); $M^{III}$=(Hf, Zr, Ti, Ta, Nb), and $M^{IV}$=(Al, Ga, Sc, Si) with $0\leq x\leq 0.1$ and $0\leq y\leq 0.1$.

11. The electroluminescence device of claim 1, wherein the light-converting element converts between 80% and 85% of the primary radiation into secondary radiation.

12. The electroluminescence device of claim 1, wherein a distance between the electroluminescence light source and the light-converting element is on an average less than three times an average wavelength of the primary radiation.

13. The electroluminescence device of claim 1, wherein a distance between the electroluminescence light source and the light-converting element is on an average less than twice an average wavelength of the primary radiation.

14. The electroluminescence device of claim 1, wherein a distance between the electroluminescence light source and the light-converting element is substantially equal to a wavelength of the primary radiation.

15. The electroluminescence device of claim 1, wherein the primary radiation has wavelengths between 200 nm and 490 nm.

16. The electroluminescence device of claim 1, further comprising an adhesion layer having a refractive index between 1.4 and 3.0 located between the electroluminescence light source and the light-converting element.

17. The electroluminescence device of claim 1, wherein the light-converting element has sides faces at an angel of 45°.

18. The electroluminescence device of claim 5, wherein an exit surface of the light-converting element includes tapered sections separated by upper and lower sections, the upper and lower sections being parallel to an exit surface of the electroluminescence light source.

19. The electroluminescence device of claim 18, wherein the tapered sections are at an angel of 45° relative the upper and lower sections, a distance between the upper and lower sections along the radiation direction is substantially 180 μm, and a thickness of the light-converting element is substantially 350 μm.

* * * * *